(12) United States Patent
Lee et al.

(10) Patent No.: US 11,004,904 B2
(45) Date of Patent: May 11, 2021

(54) DISPLAY APPARATUS AND DRIVING METHOD OF DISPLAY PANEL

(71) Applicant: SAMSUNG ELECTRONICS CO., LTD., Suwon-si (KR)

(72) Inventors: Ho-seop Lee, Seongnam-si (KR); Seung-yong Shin, Bucheon-si (KR); Jin-mo Kang, Suwon-si (KR); Sang-young Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/802,702

(22) Filed: Nov. 3, 2017

(65) Prior Publication Data

US 2018/0145116 A1    May 24, 2018

(30) Foreign Application Priority Data

Nov. 23, 2016  (KR) .......................... 10-2016-0156654

(51) Int. Cl.
   *H01L 27/32*   (2006.01)
   *G09G 3/20*   (2006.01)
   (Continued)

(52) U.S. Cl.
   CPC ........ *H01L 27/3211* (2013.01); *G09G 3/2003* (2013.01); *G09G 3/32* (2013.01);
   (Continued)

(58) Field of Classification Search
   None
   See application file for complete search history.

(56) References Cited

U.S. PATENT DOCUMENTS 9,093,025 B2 *   7/2015   Lee ...................... G09G 3/3233
10,127,856 B2 *  11/2018  Lee ...................... G09G 3/2025
(Continued)

FOREIGN PATENT DOCUMENTS

JP   2004341206 A   12/2004
JP   2006119274 A    5/2006
(Continued)

OTHER PUBLICATIONS

Search Report dated Mar. 9, 2018, issued by the International Searching Authority in counterpart International Patent Application No. PCT/KR2017/012322 (PCT/ISA/210).

(Continued)

*Primary Examiner* — William Boddie
*Assistant Examiner* — Bipin Gyawali
(74) *Attorney, Agent, or Firm* — Sughrue Mion, PLLC

(57) ABSTRACT

A display apparatus includes a display panel comprising a plurality of light emitting elements, a panel driver configured to drive the display panel by applying a current to the plurality of light emitting elements, a memory configured to store luminance information according to a current of the light emitting elements, and a processor configured to determine a target luminance of the light emitting elements based on a gray level of an image, and to control the panel driver to drive the display panel by adjusting a current applied to the light emitting elements based on the target luminance and information stored in the memory and adjusting a duty to which the adjusted current is applied.

18 Claims, 18 Drawing Sheets

(51) Int. Cl.
*G09G 3/3225* (2016.01)
*G09G 3/32* (2016.01)
*G09G 3/34* (2006.01)

(52) U.S. Cl.
CPC ......... *G09G 3/3225* (2013.01); *G09G 3/3413* (2013.01); *H01L 27/326* (2013.01); *G09G 2300/0866* (2013.01); *G09G 2310/0264* (2013.01); *G09G 2320/0285* (2013.01); *G09G 2320/0666* (2013.01); *G09G 2320/0693* (2013.01); *G09G 2360/16* (2013.01)

(56) References Cited

U.S. PATENT DOCUMENTS

| | | | | |
|---|---|---|---|---|
| 10,497,301 | B2* | 12/2019 | Watsuda | G09G 3/2074 |
| 10,706,817 | B2* | 7/2020 | Tang | G09G 3/3225 |
| 10,825,377 | B2* | 11/2020 | Lee | G09G 3/32 |
| 2004/0227456 | A1 | 11/2004 | Matsui | |
| 2006/0103612 | A1 | 5/2006 | Ozaki | |
| 2009/0195563 | A1 | 8/2009 | Xu et al. | |
| 2010/0149223 | A1 | 6/2010 | Betts-LaCroix | |
| 2010/0328336 | A1* | 12/2010 | Si | G09G 3/3666 345/589 |
| 2011/0175552 | A1* | 7/2011 | Kwon | G09G 3/3406 315/307 |
| 2012/0223649 | A1* | 9/2012 | Saes | H05B 33/0818 315/186 |
| 2013/0147385 | A1 | 6/2013 | Yang et al. | |
| 2014/0292227 | A1* | 10/2014 | Hu | H05B 33/0815 315/307 |
| 2016/0027354 | A1* | 1/2016 | Terai | G09G 3/36 345/87 |
| 2016/0104444 | A1* | 4/2016 | Miyata | G09G 3/3406 345/205 |
| 2017/0004754 | A1* | 1/2017 | Chin | G09G 3/32 |
| 2020/0234634 | A1* | 7/2020 | Li | G09G 3/3233 |

FOREIGN PATENT DOCUMENTS

| | | |
|---|---|---|
| JP | 2016-173466 A | 9/2016 |
| JP | 2016-184498 A | 10/2016 |
| KR | 1020050091701 A | 9/2005 |
| KR | 1020100005023 A | 1/2010 |
| WO | 2008099979 A2 | 8/2008 |

OTHER PUBLICATIONS

Written Opinion dated Mar. 9, 2018, issued by the International Searching Authority in counterpart International Patent Application No. PCT/KR2017/012322 (PCT/ISA/237).

* cited by examiner

DISPLAY APPARATUS AND DRIVING METHOD OF DISPLAY PANEL

CROSS-REFERENCE TO RELATED APPLICATION

This application claims priority from Korean Patent Application No. 10-2016-0156654, filed in the Korean Intellectual Property Office on Nov. 23, 2016, the disclosure of which is incorporated herein by reference in its entirety.

BACKGROUND

1. Field

Apparatuses and methods consistent with example embodiments relate to a display apparatus and a driving method of a display panel, and more particularly, to a display apparatus including a display that includes a self-luminous element driven by a current, and a driving method thereof.

2. Description of Related Art

A Light Emitting Diode (LED) is a semiconductor emitting device that converts current into light. LEDs have been increasingly used as display light sources, automotive light sources, and illumination light sources. A light emitting diode that emits white light having excellent efficiency can be realized by using a fluorescent material or combining light emitting diodes of various colors.

A light emitting diode can display an image with higher luminance as current increases. However, power consumption may increase due to the current increase.

SUMMARY

Example embodiments may address at least the above problems and/or disadvantages and other disadvantages not described above. Also, the example embodiments are not required to overcome the disadvantages described above, and may not overcome any of the problems described above.

One or more example embodiments provide a display apparatus capable of providing a high luminance with low current based on luminance characteristics according to current of each sub pixel, and a driving method thereof.

According to an aspect of an example embodiment, there is provided a display apparatus including: a plurality of light emitting elements; a panel driver configured to drive the display panel by applying a current to the plurality of light emitting elements; a memory configured to store luminance information according to a current of the light emitting elements; and a processor configured to: determine a target luminance of the light emitting elements based on a gray level of an image; and control the panel driver to drive the display panel by adjusting a current applied to the light emitting elements based on the target luminance and the stored luminance information, and by adjusting a duty to which the adjusted current is applied.

The processor may be further configured to reduce the current applied to the light emitting elements, elevate a gray level of the image to compensate a luminance value lowered according to the reduced current, and increase a duty to which the adjusted current is applied to correspond to the elevated gray level.

The processor may be further configured to determine a target luminance of the light emitting elements in a same recognition luminance range as a luminance of the light emitting elements corresponding to a gray level of the image.

The light emitting elements may include a plurality of sub pixels, and the luminance information may include luminance information according to a current for each of the sub pixels.

The processor may be further configured to reduce a current value applied to at least one sub pixel in which a luminance increase rate is greater than a current increase rate based on the luminance information according to the current for each of the sub pixels.

The processor may be further configured to, in response to the target luminance belonging to a luminance interval in which the luminance increase rate is greater than the current increase rate, reduce a current value applied to the at least one sub pixel and increase a duty to which the current is applied.

The light emitting elements may include a plurality of sub pixels, and the luminance information may include current control information according to a luminance for each sub pixel calibrated based on luminance information according to a current for each of the sub pixels.

The processor may be further configured to divide the display panel into a plurality of local areas and determine a target luminance value for each of the local areas based on a maximum gray level value of an image displayed in each local area, and determine a current value applied to each local area based on a target luminance value of each local area.

The processor may be further configured to, in response to a current value applied to each of the local areas being determined, readjust a current value applied to each of the local areas by applying a low pass filtering.

The light emitting elements may be implemented as a red LED (light-emitting diode), a green LED, and a blue LED.

According to an aspect of another example embodiment, there is provided a driving method of a display panel including a plurality of light emitting elements, the method including: determining a target luminance of the light emitting elements based on a gray level of an image; and adjusting a current applied to the light emitting elements based on the target luminance and luminance information according to a current of the light emitting elements, and adjusting a duty to which the adjusted current is applied.

The adjusting may include reducing the current applied to the light emitting elements, elevating a gray level of the image to compensate a luminance value lowered according to the reduced current, and increasing a duty to which the adjusted current is applied to correspond to the elevated gray level.

The method may further include determining a target luminance of the light emitting elements in a same recognition luminance range as a luminance of the light emitting elements corresponding to a gray level of the image.

The light emitting elements may include a plurality of sub pixels, and the luminance information may include luminance information according to a current for each of the sub pixels.

The adjusting may include reducing a current value applied to at least one sub pixel in which a luminance increase rate is greater than a current increase rate based on luminance information according to the current for each of the sub pixels.

The adjusting may include, in response to the target luminance belonging to a luminance interval in which a luminance increase rate is greater than the current increase rate, reducing a current value applied to the at least one sub pixel based on the luminance information according to the current for each of the sub pixels.

The light emitting element may include a plurality of sub pixels, and the luminance information may include current control information according to luminance for each of sub pixels calibrated based on luminance information according to a current for each of the sub pixels.

The determining the target luminance of the light emitting elements may include dividing the display panel into a plurality of local areas, and determining a target luminance value for each of the local areas based on a maximum gray level value of an image displayed in each of the local areas, and the adjusting may include determining a current value applied to each of the local areas based on a target luminance value of each of the local areas.

The method may further include, in response to a current value applied to each of the local areas being determined, readjusting a current value applied to each of the local areas by applying a low pass filtering.

The light emitting elements may be implemented as a red LED, a green LED, and a blue LED.

According to an aspect of another example embodiment, there is provided a display apparatus including: a panel driver configured to drive a display panel by applying a current to a plurality of light emitting elements; and a processor configured to: determine a target luminance of each light emitting element based on a gray level of an image; control the panel driver to adjust the current applied to each light emitting element based on the target luminance and luminance information that is stored in a memory and to adjust a time to which the adjusted current is applied.

The adjusting the current applied to each light emitting element may include adjusting a duty to which the adjusted current is applied.

The processor may be further configured to reduce a current value applied to at least one pixel in which a luminance increase rate is greater than a current increase rate based on the luminance information according to the current for each pixel.

As described above, according to various example embodiments, the power consumption of the display apparatus can be reduced while maintaining the luminance quality.

BRIEF DESCRIPTION OF THE DRAWINGS

The above and/or other aspects will be more apparent by describing example embodiments with reference to the accompanying drawings. Understanding that these drawings depict example embodiments of the disclosure and are not to be considered as limiting the scope of the disclosure, the principles herein are described and explained with additional specificity and detail through the use of the accompanying drawings, in which.

DETAILED DESCRIPTION

Below, example embodiments will be described in detail with reference to the accompanying drawings.

Figure 1:
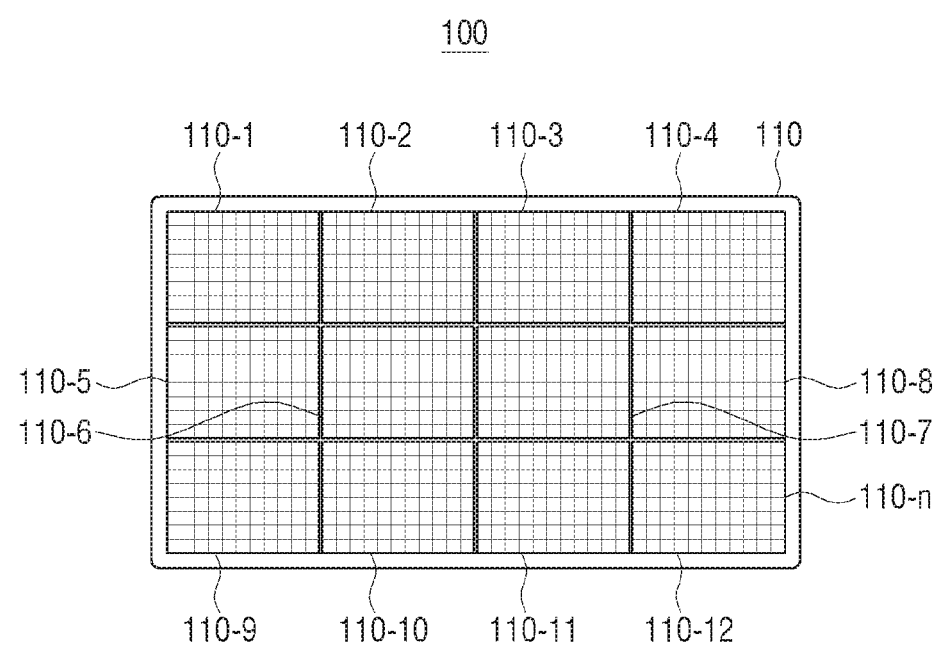
FIG. 1 is a diagram illustrating a configuration of a display apparatus according to an example embodiment.

FIG. 1 is a diagram illustrating a configuration of a display apparatus according to an example embodiment.

According to an example embodiment illustrated in FIG. 1, a display apparatus 100 may be realized with at least one display module 110-1, 110-2, 110-3, 110-4, . . . , 110-12, . . . , 110-n, which are physically connected to each other. Each of the display modules may include a number of pixels arranged in a matrix form, for example, self-luminous pixels. The display apparatus module may be implemented as a LED module in which each of a number of pixels is realized as a LED pixel, or a LED cabinet in which a plurality of LED modules are connected to each other, but example embodiments are not limited thereto. For example, the display module may be realized as a liquid crystal display (LCD), an organic LED (OLED), an active-matrix OLED (AMOLED), a Plasma Display Panel (PDP), and the like. However, for convenience of description, below it will be described such that each display module is realized as an LED cabinet.

The LED is an optical semiconductor element that converts electrical energy to light energy. The LED is a kind of p-n junction diode. A principle of light generation is that electrons in n region move to p region by the current supplied from the outside. After electrons and holes recombine in the junction, the electrons are reduced to their base state and emit energy or light. In this case, the wavelength band of the emitted light is formed in various forms based on the energy band value, and the color of light is determined based on the wavelength.

In addition, the LED is a current driving element, and the brightness varies according to the intensity of the current. Accordingly, to implement high luminance in a display including LEDs, a current value may be increased. However, if the current value is increased, the power consumption is increased as well. Thus, according to one or more example embodiments, various LED driving methods capable of reducing power consumption while maintaining luminance using the element characteristics of the LED will be described.

Figure 2A:
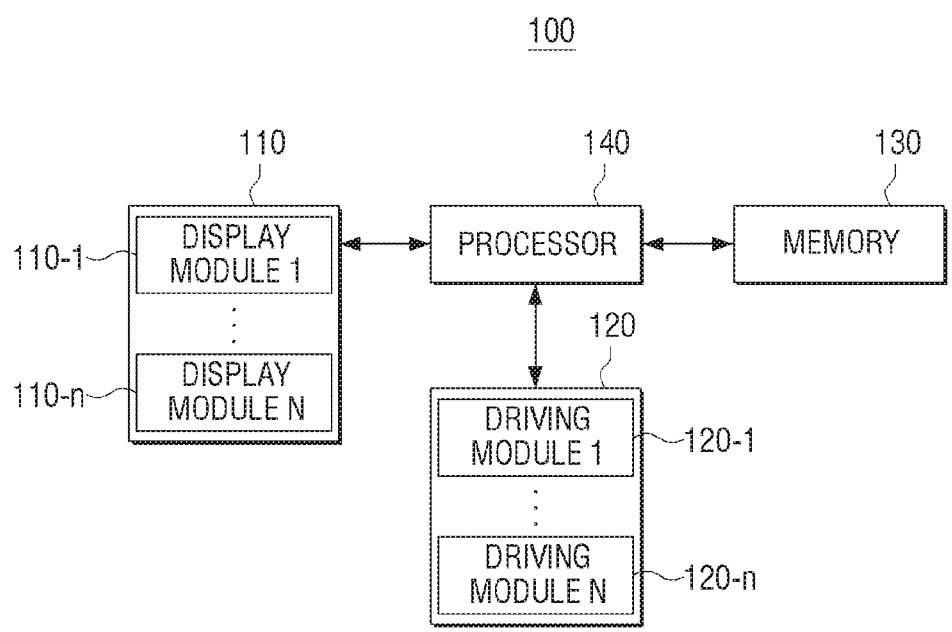
FIGS. 2A and 2B are diagrams illustrating a configuration of a display apparatus according to an example embodiment.

FIG. 2A is a block diagram illustrating a configuration of a display apparatus according to an example embodiment.

According to FIG. 2A, the display apparatus 100 includes a display panel 110, a panel driving unit 120 (e.g., panel driver), a storage 130 (e.g., memory), and a processor 140.

The display apparatus 110 includes a plurality of display modules. The display panel 110 may be formed such that at least one display module 110-1, ..., 110-*n* (n≥1) are connected to each other and assembled. Each of the plurality of display modules may include a number of pixels arranged in a matrix form, for example, self-luminous pixels. According to an example embodiment, the display panel 110 may be realized as a plurality of LED modules (LED module including at least one LED element) and/or a plurality of LED cabinets. In addition, the LED module may include a plurality of LED pixels. For example, the LED pixel may be realized as an RGB LED, and the RGB LED may also include a red LED, a green LED, and a blue LED. However, the display panel 110 may also be realized as one display module.

The panel driving unit 120 (e.g., panel driver) drives a display panel 110 according to a control of the processor 140. For example, the panel driving unit 120 applies a driving voltage or drives a driving current to drive each self-luminous element, for example, LED pixel, included in the display panel 110 according to a control of the processor 140, to thereby drive each LED pixel.

Figure 2B:
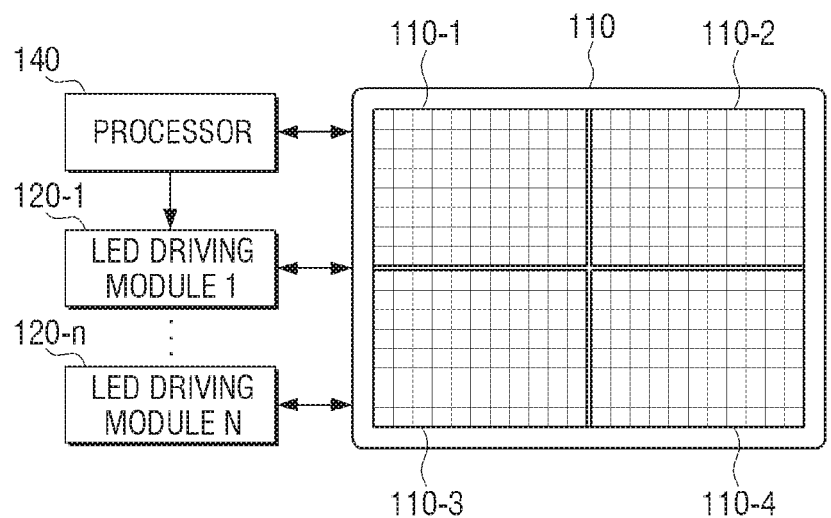

The panel driving unit 120 includes at least one LED driving module 120-1, ..., 120-*n* connected to each of at least one display module 110-1, ..., 110-*n*, as illustrated in FIG. 2B. At least one LED driving module 120-1, ..., 120-*n* supplies a driving current to at least one display module 110-1, ..., 110-*n* to correspond to each control signal input from the processor 140 to drive at least one display module 110-1, ..., 110-*n*.

At least one LED driving module 120-1, ..., 120-*n* may regulate a supply time or an intensity of a driving current that is supplied to at least one display module 110-1, ..., 110-*n* to correspond to each control signal input from the processor 140 and output the same.

Each of the at least one LED driving module 120-1, ..., 120-*n* may include at least one LED driver to control a current applied to the LED element. According to an example embodiment, the LED driver may be disposed at the rear end of the power supply and receive a voltage from the power supply. However, according to another example embodiment, it may receive a voltage from a separate power supply device. It is also possible that the SMPS and the LED driver are realized in the form of one integrated module. In this case, the power supply is hardware which converts AC current to DC power such that it is stably used in at least one display module 110-1, ..., 110-*n*, and supplies suitable power to each system. For example, the power supply may be implemented as a switching mode power supply (SMPS).

The LED driver may use a pulse-width modulation (PWM) method which controls brightness by adjusting a width of frequency. That is, the LED driver may express various gray levels of an image using a dimming method which adjusts the width of a frequency.

The LED driver may be included in each of a plurality of LED areas including a plurality of LED elements. In this case, the LED area may be an area that is smaller than the LED module mentioned above. For example, one LED module may be divided into a plurality of LED areas including the predetermined number of LED elements, and each of the plurality of LED areas may include an LED driver. In this case, a current control may be performed for each area. However, example embodiments are not limited thereto, and the LED driver may also be included on an LED module basis.

According to an example embodiment, each of the display modules 110-1, ..., 110-*n* may be realized to include a sub processor for controlling an operation of each display module and a driving module to drive each display module according to a control of the sub processor. In this case, each sub processor and driving module may be realized as a hardware, software, firmware and/or integrated chip (IC). According to an example embodiment, each sub processor may be realized as a separate semiconductor IC.

The storage 130 stores various data that may be required for an operation of the display apparatus 100.

In this case, the storage 130 may be realized as an internal memory such as ROM, RAM included in the processor 140, or may be realized as a memory separate from the processor 140. In this case, the storage 130 may be realized in the form of a memory embedded in the display apparatus 100, or may be realized in the form of a memory that may be detached from the display apparatus 100 according to the usage of data storage.

For example, data for driving the display apparatus 100 may be stored in a memory embedded in the display apparatus, and data for an extension function of the display apparatus 100 may be stored in a memory that may be detached from the display apparatus 100. The memory embedded in the display apparatus 100 may be realized in the form of a non-volatile memory, volatile memory, hard disk drive (HDD), solid state drive (SDD), and the like, and the memory that is detached from the display apparatus 100 may be realized in the form of a memory card (e.g., micro SD card, USB memory), an external memory that is connectable to a USB port (e.g., USB memory), and the like.

The storage 130 may store luminance information according to a current of a light emitting element.

The light emitting element may include a plurality of sub pixels, and the luminance information may include luminance information according to a current for each sub pixel. For example, the luminance level information according to the current for each sub-pixel may be the degree of luminance change according to the current change for each R/B/G LED device. The LED is a current-driven device whose brightness varies according to current, and R/G/B LED has a unique resistance value for each color. Accordingly, when the same current and voltage are applied, the power to be applied varies, and thus the brightness varies depending on each R/G/B LED. As described above, the information about the luminance change according to the current change for each R/B/G LED device may be stored in the storage 130.

The luminance information may include current control information according to a luminance for each sub pixel calibrated (modeled) based on luminance information according to current for each sub pixel.

According to an example embodiment, the current control information according to luminance for each sub pixel may be current gain information for each luminance of each sub pixel calibrated based on luminance level information according to current for each sub pixel.

In this case, the current gain information according to luminance for each sub pixel may be current gain value for each luminance for each sub pixel acquired by calibrating a current value such that a luminance change amount for each R/B/G LED device according to a current change is similar. However, example embodiments are not limited thereto, and the current control information may be the current value itself, not a current gain value.

In addition, the storage 130 may store a conversion coefficient to convert a RGB value into a XYZ color coordinate value. The storage 130 may store a conversion coefficient for each current within a range of current that may be applied to the LED device. For example, if a current of 0-63 mA can be applied to each R/G/B LED device, the storage 130 may store a conversion coefficient for each current of 0-63 mA of red LED, a conversion coefficient for each current of 0-63 mA of green LED, and a conversion coefficient for each current of 0-63 mA of blue LED. In this case, the conversion coefficient may be in a 3×3 matrix form, and a conversion coefficient for each current for each of the R/G/B LED device may be calculated in advance and stored in the storage 130.

For example, the conversion coefficient stored in the storage 130 may be a conversion coefficient for each current calibrated based on the luminance and color characteristics of each sub pixel according to a current increase.

Each of the R/G/B LED devices has a feature that the luminance and color characteristics are not changed equally but changed differently depending on the current. For example, as illustrated in FIGS. 3A-3C, the R/G/B LED device has different color shift characteristics such that a color coordinate changes to a different from according to a current increase.

Figure 3A:
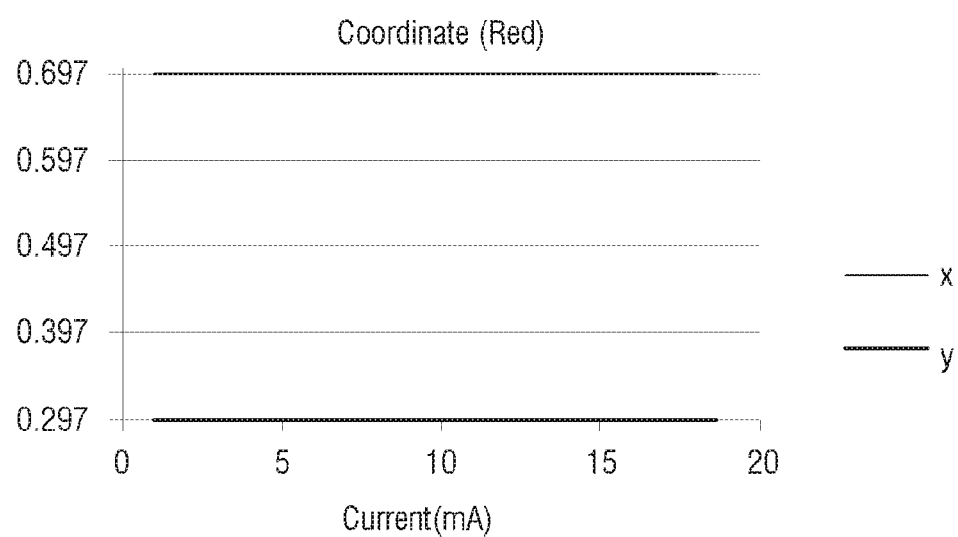
FIGS. 3A-3C are diagrams illustrating characteristics of an LED element according to current.

For example, as illustrated in FIG. 3A, the red pixel maintains the same x and y coordinates as the current increases. However, as illustrated in FIG. 3B, the green pixel are slightly changed, and as illustrated in FIG. 3C, the blue pixel shows a more significant change in the x and y coordinates as the current increases.

Figure 3B:
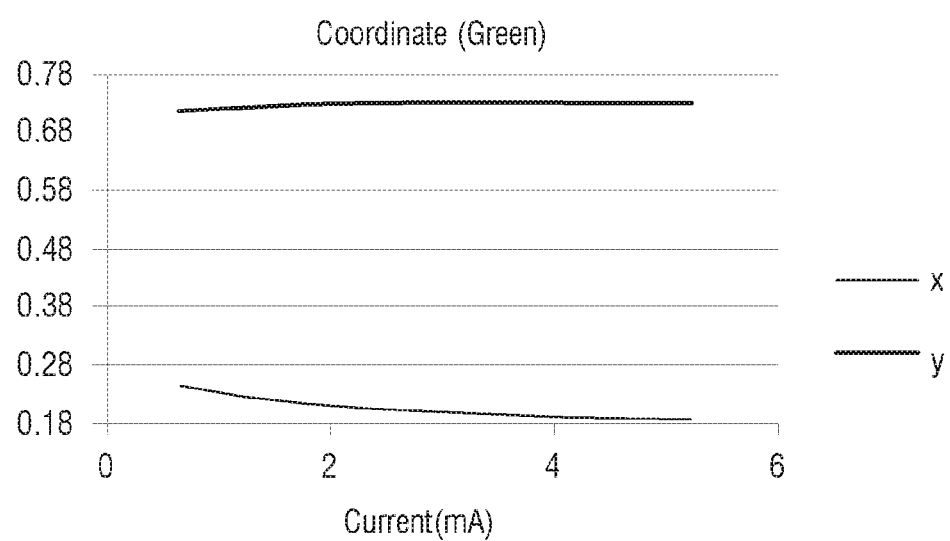
Figure 3C:
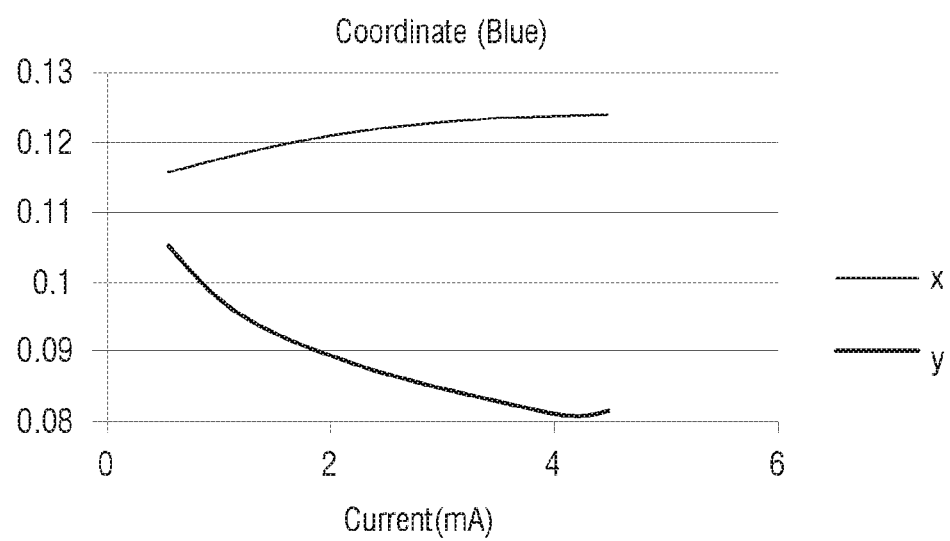
Figure 5:
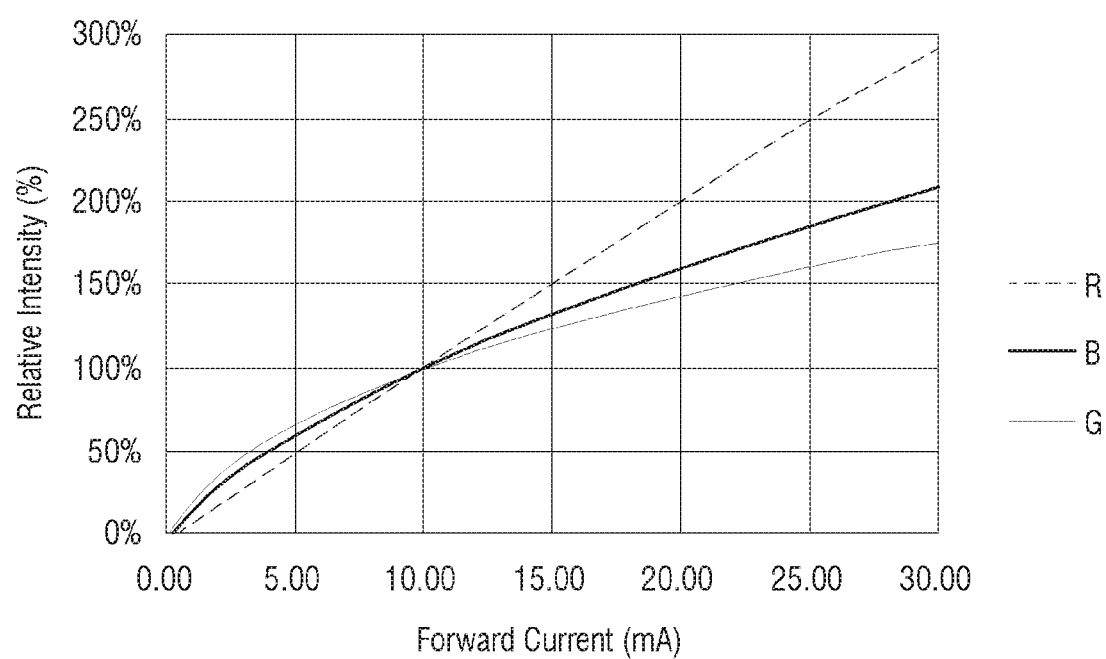
FIG. 5 is a diagram illustrating luminance characteristics according to current increase for each sub pixel according to an example embodiment.

Accordingly, the storage 130 may store a conversion coefficient for each current of a R/G/B LED device calculated by reflecting color characteristics of a current of the R/G/B LED device as illustrated in FIGS. 3A-3C and luminance characteristics according to a current of the R/G/B LED device as illustrated in FIG. 5.

In addition, the storage 130 may store a luminance correction coefficient for each pixel, information on a binning group, information on a maximum luminance per pixel, information on a color per pixel, and the like. In this case, the binning group may be a group of LED pixels having the same characteristics (luminance, color coordinate, etc.) as much as possible for LED pixels.

For example, to match the maximum luminance to the target luminance for the uniformity characteristic between a plurality of LED pixels, the luminance is adjusted down through calibration using a luminance correction coefficient. In this case, the luminance correction coefficient may be in a 3×3 matrix form to realize the target R/G/B luminance, and it is possible to implement uniformity by applying different luminance correction coefficients to each pixel so that the maximum luminance becomes the target luminance. In addition, the target luminance may be implemented based on parameters in a 3×3 matrix form corresponding to each of the R/G/B device, and a color temperature may also be calibrated to have uniformity.

In addition, the storage 130 may also store information on the number of pixels included in each of a plurality of display modules, the size of pixels, and interval between pixels.

According to another example embodiment, the above-mentioned information stored in the storage 130 may not be stored in the storage 130, but may be acquired from an external device. For example, some information may be received from an external device, such as a set-top box, external server, user terminal, and the like, in real time.

The processor 140 controls overall operations of the display apparatus 100. The processor 140 may include one or more of a central processing unit (CPU), controller, application processor (AP), communication processor (CP), ARM processor, or the like.

In addition, the processor 140 may include a graphic processing unit (GPU) to perform graphic processing corresponding to the image. The processor 130 may be implemented as a system on chip (SoC) including a core and a GPU. The processor 140 may include a single core, dual core, triple core, quad core, and multiples of cores.

The processor 140 may determine the target luminance of a light emitting element based on an input image.

The processor 140 may determine the target luminance corresponding to gray level of an input image based on the maximum output luminance of a plurality of luminance elements included in the display panel 110. For example, if the maximum output luminance of the display panel 110 is 100 nit and the gray level of the input image is 200 gray levels (based on a 8-bit image), the target luminance may be determined based on 100 nit×200/255.

However, according to circumstances, a luminance value smaller than the luminance corresponding to a gray level of an input image may be determined as the target luminance. For example, according to the Just Noticeable Difference (JND) theory, the luminance value within the range recognized by the user to have the same luminance value as the luminance value corresponding to the gray level of the input image may be determined as the target luminance value.

The processor 140 may adjust the current application time when the target luminance is determined, and control the panel driving unit 120 to implement the target luminance. In this case, the current application time may be adjusted by the current application duty. That is, the current application duty of a light emitting device may be adjusted in a predetermined time period based on a synchronization signal and adjust the current application time. In this case, the current application time in a predetermined time interval may be realized as a continuous application time or the sum of non-continuous application time.

Figure 4:
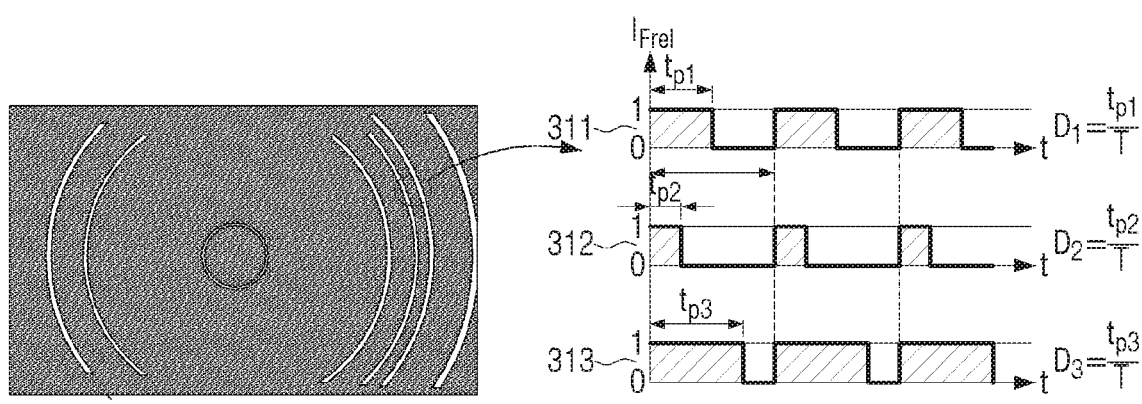
FIG. 4 is a diagram illustrating a driving method according to an example embodiment.

FIG. 4 is a diagram illustrating a driving method according to an example embodiment.

Referring to FIG. 4, when implementing a gray level of an image, the same predetermined current ($I_{Frel}$) is applied to each pixel and a current application time is controlled to be different per gradation of each pixel, and thereby the gradation of the corresponding pixel is expressed. In this case, a predetermined current is determined based on the characteristics of a plurality of light emitting elements included in the display panel 110 when the corresponding display apparatus 100 is manufactured.

For example, as illustrated in FIG. 4, the current application time ($t_{p1}$, $t_{p3}$) is adjusted 311, 313 long for a pixel in an area with high gradation, and the current application time ($t_{p2}$) is adjusted 312 short for a pixel in an area with low gray level, and thereby the corresponding gray level value is expressed. Thus, the duty cycle $D_1$ for the pixel in the area corresponding to 311 is equal to $t_{p1}/T$, the duty cycle $D_2$ for the pixel in the area corresponding to 313 is equal to $t_{p2}/T$, and the duty cycle $D_3$ for the pixel in the area corresponding to 313 is equal to $t_{p3}/T$.

However, according to an example embodiment, when the target luminance is determined, the processor 140 may adjust the intensity of current applied to a light emitting element based on information stored in the storage 130, and control the panel driving unit 120 to adjust a time for which the adjusted current is applied to implement the target luminance.

The processor 140 may control the panel driving unit 120 to adjust a duty to which a current is applied to reduce applied to the light emitting element and implement the target luminance based on the information stored in the storage 130.

The processor 140 may control the panel driving unit 120 to implement the target luminance by reducing a current value with respect to at least one sub pixel of which luminance increase ratio according to a current is larger than a predetermined value among a plurality of sub pixels and increasing a current application duty.

If the target luminance of a sub pixel belongs to a luminance interval of which luminance increase ratio is larger than a current increase ratio, the processor 140 may control the panel driving unit 120 to implement the target luminance by reducing a current value applied to at least one sub pixel and increasing a time for which a current is applied.

FIG. 5 is a diagram illustrating luminance characteristics according to current increase for each sub pixel according to an example embodiment.

As illustrated in FIG. 5, the R/G/B LED device has different luminance increase characteristics according to a current increase.

For example, referring to FIG. 5, as for the red LED, the luminance increase rate is nearly constant according to a current increase. However, as illustrated for the green LED and the blue LED, the luminance increase rate is relatively larger than the current increase ratio up to a predetermined current interval. That is, in the predetermined interval, even if the same current is applied to each of the R/G/B LED device, the G LED device has the largest relative luminance value, and the R LED device has the lowest relative luminance value. However, FIG. 5 illustrates the characteristics of an example R/G/B LED device, and the characteristics of the R/G/B LED device may vary according to a manufacturing process.

If such characteristics of device are used, power consumption may be considerably reduced while implementing the same luminance.

Figure 6A:
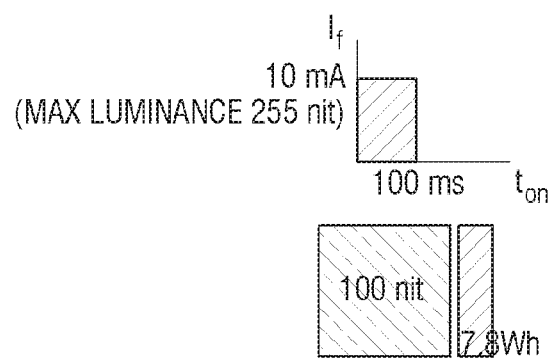
FIGS. 6A to 6C are diagrams illustrating a relationship between the current intensity, the duty, and the power consumption, according to one or more example embodiments.
Figure 6B:
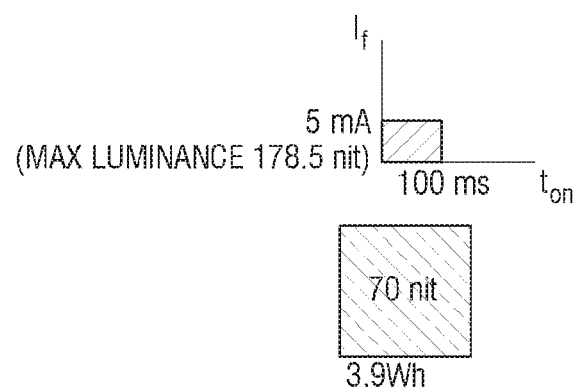
Figure 6C:
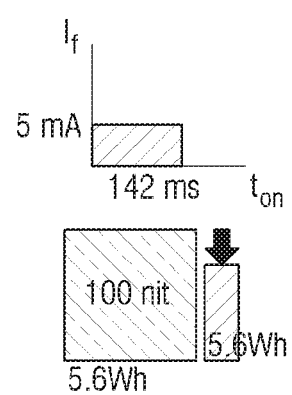

The detailed description will be provided with reference to FIGS. 6A to 6C.

As illustrated in FIG. 6A, a current of 10 mA may be applied to the green LED for 100 ms to implement the luminance of 100 nit, and in this case, it is assumed that the power consumption is 7.8 Wh.

As illustrated in FIG. 6B, when the current is reduced by half, that is, to 5 mA, the luminance is not reduced by 50% according to the luminance characteristics of the green LED, but is reduced to 70%, that is, 70 nit. In this case, the $I_f$ is reduced by half in the power calculation equation Power=$V_f*I_f*t_{on}$, and thus, the power consumption is reduced to 3.9 Wh.

Accordingly, as illustrated in FIG. 6C, when the gray level is increased by a predetermined amount, that is, when $t_{on}$ is increased to 142 ms, the power consumption is reduced (by 30%) to 5.6 Wh while expressing the same luminance 100 nit.

According to another example embodiment, the processor may use the Just Noticeable Difference (JND) theory as mentioned above, to determine a luminance decrease value.

For example, the processor 140 may determine a luminance value within the range recognized by the user to be the same luminance value as the original luminance value as the target luminance value. For example, when the original luminance value is 100 nit and the user perceives that 90-100 nit are the same luminance value, 90 nit may be determined as the target luminance value. In this case, the original luminance value may be a luminance value corresponding to the original gray level of the image.

According to an example embodiment, the target luminance value according to the reduced current decrease may be determined based on the JND theory, and when it is possible to implement the target luminance value by only the current decrease, a gray level compensation may not be performed. However, when implementing the target luminance value is not possible by only the current decrease, some gray level compensation may be performed.

The processor 140 may divide the display panel 110 into a plurality of local areas, and determine the target luminance value for each of the areas.

The processor 110 may divide the display panel 110 into a plurality of local areas, and determine the target luminance value for each of the local areas based on the maximum gray level value of an image displayed in each of the local areas.

Thereafter, the processor 140 may determine a value of current applied to each local area based on the target luminance value of each local area.

In addition, when a value of current applied to each local area is determined, the processor 140 may adjust a value of current applied to each area by applying low pass filtering.

In this case, the processor 140 may calculate a color coordinate of the R, G, B gray level values before compensation and the R', G', B' gray level values compensated to coincide with the color coordinate of the R', G', B' gray level values after compensation based on the adjusted current value applied to each local area.

The processor 140 may convert the R/G/B gray level values of an input image to the X, Y, Z color coordinate values based on a conversion coefficient corresponding to the current value before adjustment. Accordingly, the processor 140 may calculate the R', G', B' gradation values after compensation by multiplying an inverse matrix of a conversion coefficient corresponding to a current value after adjustment by the X, Y, Z color coordinate values.

Below, the low power-driven method according to current adjustment will be described in greater detail with reference to the accompanying drawings.

Figure 7:
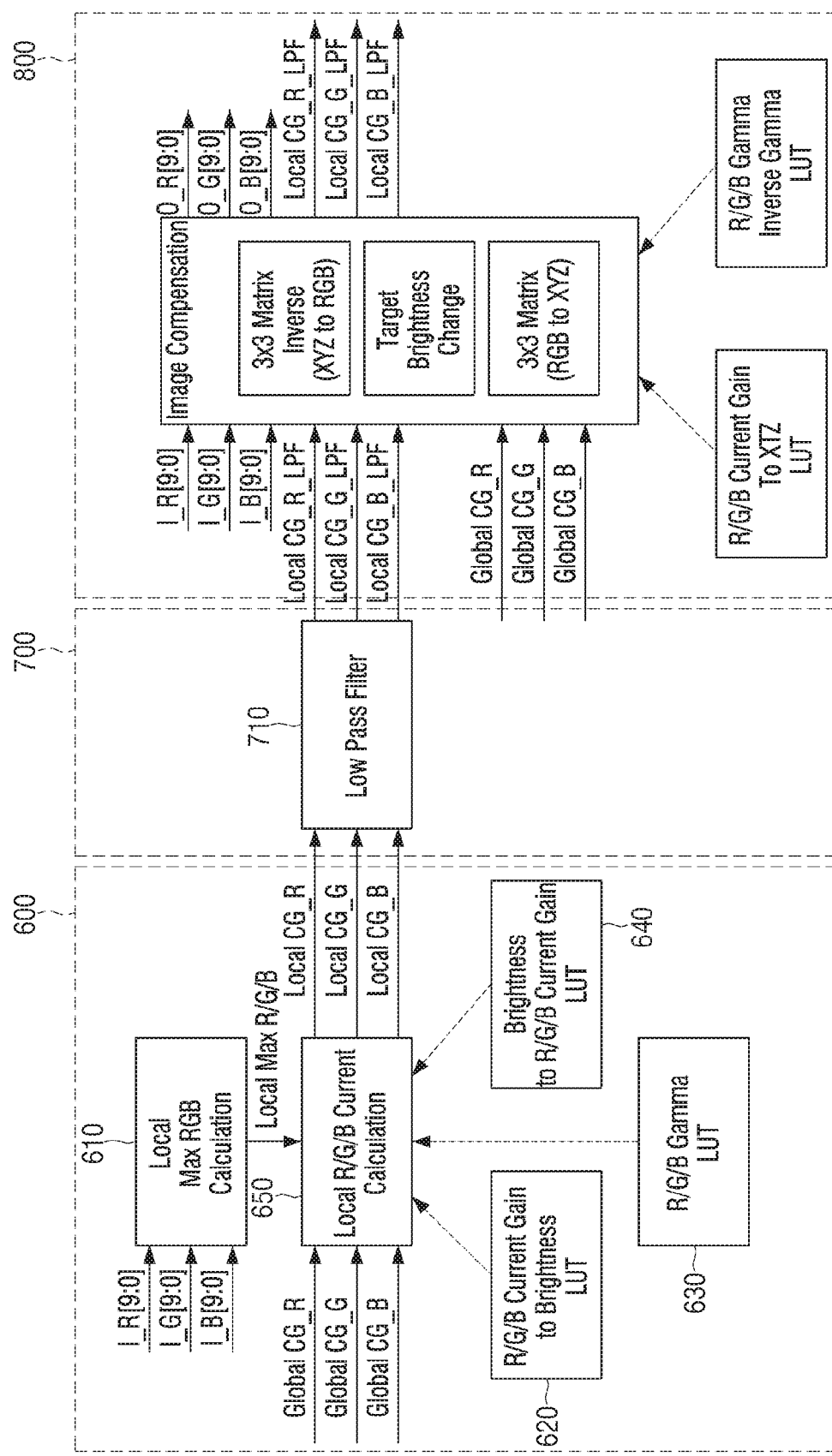
FIG. 7 is a schematic diagram illustrating a low consumption driving method according to an example embodiment.

FIG. 7 is a schematic diagram illustrating a low consumption driving method according to an example embodiment.

Referring to FIG. 7, the low power-driven method according to an example embodiment may include a current gain determining step 600, a filtering step 700, and an image compensation step 800. However, the filtering step 700 may be selectively omitted.

In the current determining step 600, the processor 140 may calculate 610 the maximum gray level value of an input image, and calculate the corresponding current adjustment value (or current gain value) (Local CG_R, Local CG_G, Local CG_B) based on the maximum gray level value.

The processor 140 may divide an input image frame into a plurality of local areas, and calculate the maximum gray level value for each local area and then calculate the corresponding current adjustment value (Local CG_R, Local CG_G, Local CG_B) for each local area. The Local R/G/B Current Calculation, performed in step 650, may take inputs from the Local Max RGB Calculation step 610, a R/G/B Current Gain to Brightness Look Up Table (LUT) 620, a R/G/B Gamma LUT 630, and a Brightness to R/G/B Current Gain LUT 640, and output the Local CG_R, Local CG_G, and Local CG_B to a Low Pass Filter at step 700. Here, the local area may be an area in which an LED driver is provided and current adjustment is available. For example, as described above, one LED module may be divided into a plurality of LED areas including the predetermined number of LED elements, and each of the plurality of LED areas may include an LED driver. In this case, a current control may be performed for each local area.

The processor calculates a current adjustment value based on the maximum gray level value for at least the following non-exclusive reasons. According to an example embodiment, after decreasing the current gain, the lowered luminance value is compensated by increasing the gray level value in accordance with the decrease of the current gain. In other words, it is impossible to compensate a pixel area having the maximum gray level value to higher gray level. For example, while a pixel area has 1023 gray level (10-bit image), when a current gain is decreased, the corresponding pixel area may be compensated to higher gray level and displayed to compensate the lowered gray level value. However, because 1023 gray level is the highest gray level, it is impossible to compensate it to higher gray level. However, when a current gain capable of expressing the maximum gray level value in each local area is used, the problem mentioned above can be solved.

Assume, for example, that the maximum gray level values of a plurality of pixels included in the first to fourth local areas are respectively, 255, 200, 50 and 150 gray levels (based on 8-bit image). In this case, as for the first local area, it is impossible to elevate a gray level of a pixel having the maximum gray level value, the current value may not be lowered. However, as for the second, third and fourth areas, 200, 50 and 150 gray levels may be elevated to 255, respectively, and thus, the current value may be lowered based thereon. For example, when the original current value is 45 mA, the current value of the first local area is maintained 45 mA, and the current values of the second to fourth areas may be 39 mA, 9 mA, and 30 mA, respectively.

The processor 140 does not directly use the maximum gray level value of an input image, but may determine a current gain to be adjusted using the maximum output luminance value generated by converting the maximum gradation value of the input image based on a gamma table (or gamma curve). In this case, the gamma table (or gamma curve) is a graph showing a gamma based on the relationship between the brightness (gray level) of an input signal and the output luminance. A gray level to which x-axis is input, that is gray level (mainly 8 bit and in this case, it may be expressed in 256 stages of gray), the luminance to which Y-axis is output (%), and a slope are gamma values. The eyes of a person can distinguish the difference in the dark, but not the difference in the light, and thus, if a gamma value is set in direct proportion to 1, they will not be able to distinguish bright colors as you go to higher gray. Accordingly, the gamma value is set to be optimized for the human eye and can be National Television System Committee (NTSC) standard gamma value of 2.2.

For example, the maximum gray level value of a 10-bit input image may be converted to the corresponding maximum output luminance value based on the Equation 1 below.

$$Lv_G(\text{image}_G(\text{Local Max } G), \text{Global CG\_G}) = \qquad \text{[Mathematical formula 1]}$$
$$Lv_G(\text{image}_G(1023), \text{Global CG\_G})$$
$$\times \left( \frac{\text{image}_G(\text{Local Max } G)}{\text{image}_G(1023)} \right)^{\gamma}$$

Here, $\gamma=2.2$.

For example, according to an example embodiment described above, the maximum output luminance value of the first to fourth areas may be the luminance values A, B, C and D corresponding to 255, 200, 50, 150 gray levels, respectively, in a gamma table.

Figure 8A:
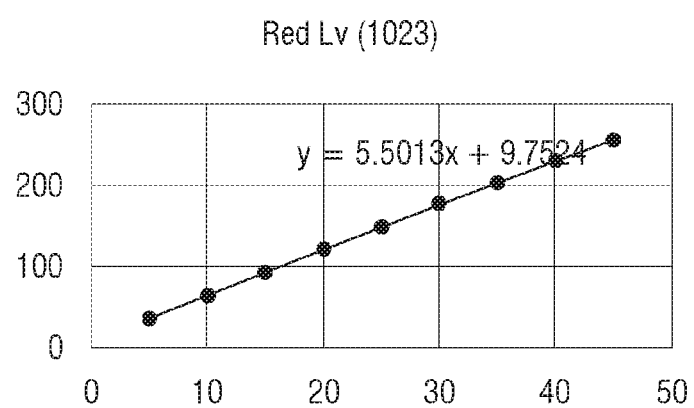
FIG. 8A to 8C are diagrams illustrating a luminance value graph according to current gain for each sub pixel according to an example embodiment.
Figure 8B:
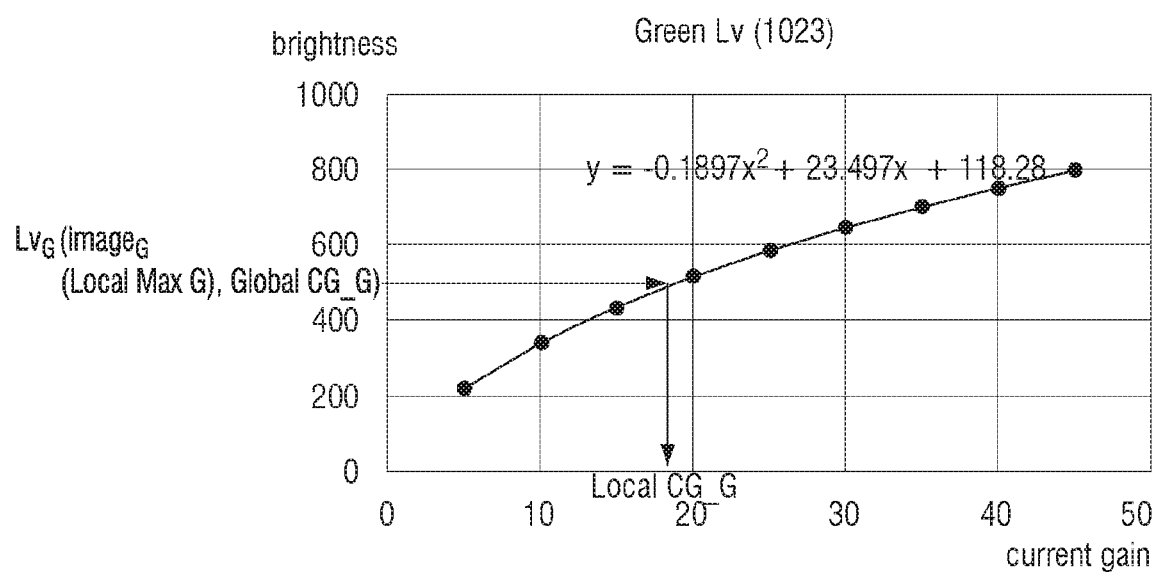
Figure 8C:
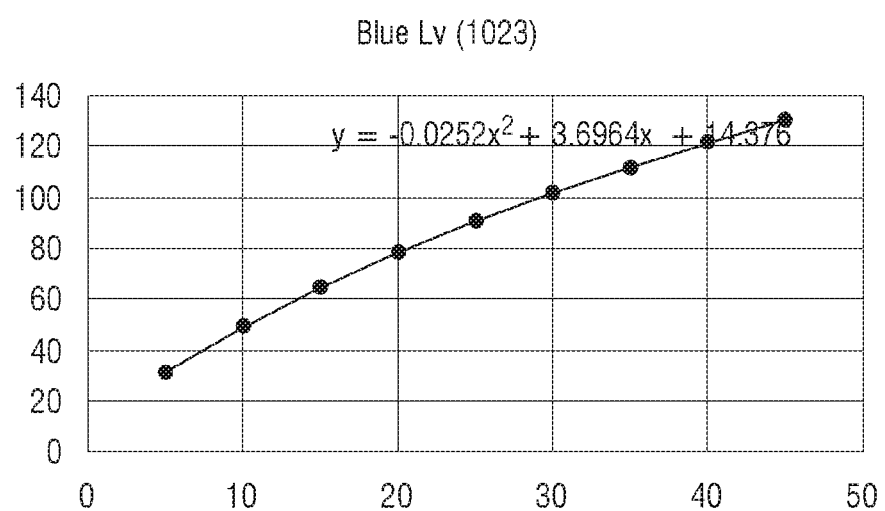

As described above, when the maximum output luminance value corresponding to the maximum gray level value of a particular local area is calculated, a current gain to be adjusted may be calculated based on a luminance value graph according to a current gain for each of the sub pixels illustrated in FIGS. 8A-8C.

FIGS. 8A-8C illustrate the relationship between a current gain and a maximum luminance value based on when the display apparatus 100 displays the maximum gray level value (that is, when the display apparatus 100 emits light at the luminance level). For example, referring to a graph of a green sub pixel illustrated in FIG. 8B, when a current gain is approximately 45, the maximum gray level value (that is, the output gray level value corresponding to the maximum gray level) is approximately 800 nit.

When the output gray level value corresponding to the maximum gray level value of the green sub pixel of a particular local area is 500 nit, the processor 140 may decrease the current gain to approximately 18 according to the graph of FIG. 8B. In this method, the Local CG_G value is determined, and a current gain to be adjusted, that is, the Local CG_R value and the Local CG_B value, may be determined based on the graphs of FIGS. 8A and 8C for the red sub pixel and the blue sub pixel, respectively.

As described above, when the current gain to be adjusted is determined by the current gain determining step 600, filtering with respect to the current gain adjusted in the filtering step 700 is performed.

Figure 9:
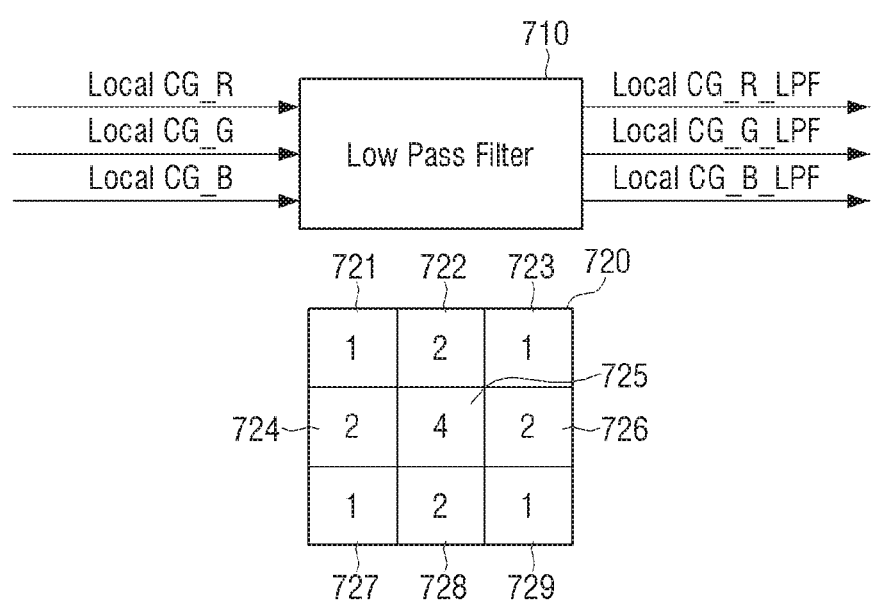
FIG. 9 is a diagram illustrating a filtering method of a current for each area according to an example embodiment.

For example, a low pass filtering 710 may be performed by the filtering mask 720 as illustrated in FIG. 9. The reason for performing the low pass filtering 710 is to compensate for a case in which the difference in current gain is great for each local area and the luminance difference in each local region is severe. Accordingly, smoothing of the current gain of each local area using a predetermined filtering mask (or smoothing mask) to express a natural luminance change.

For example, when one image frame is divided into nine local areas 721-729, respectively driven by nine LED drivers, the processor 140 may perform filtering by the filtering mask 720 in the form illustrated. In this case, the low pass filtering 710 may be performed in the form that the filtering mask 720 corresponding to the current gain for each local area determined in the current gain determining step 600 is applied.

However, the filtering step 700 may be omitted according to circumstances.

On the other hand, when a current gain for each local area is filtered in the filtering step 700, in the image compensation step 800, the gray level of the image is compensated to compensate for the output luminance which is lowered by the filtered current gains (Local CG_R_LPF, Local CG_G_LPF, Local CG_B_LPF) for each local area.

The processor 140 may calculate a compensation gray level so that the color coordinate corresponding to the original gray level of the input image is the same as the color coordinate corresponding to the compensation gray level. When a current before compensation is applied, the processor 140 may calculate a compensation gray level so that the color coordinate corresponding to the original gray level of the input image is the same as the color coordinate corresponding to the compensated gray level when reduced current is applied. This is to prevent color shift due to current intensity adjustment and gray level adjustment according to an example embodiment.

In this case, the processor 140 may use a luminance value generated by converting the gray level value based on the gamma table (or gamma curve) mentioned above for color coordinate calculation.

The processor 140 may calculate a luminance value generated by converting the gray level of the input image based on the above-mentioned gamma table (or gamma curve). In the Equation 2 below, R, G and B represent luminance values (hereinafter referred to as "luminance values of the input image) generated by gamma-converting the gray level of the input image. Below, the R, G and B will be referred to as the gray level value of the image for the convenience of explanation.

Thereafter, the processor 140 converts the gray level values R, G and B of the input image into the color coordinate values (or tristimulus values) of the XYZ color space. The processor 140 may be a conversion coefficient corresponding to a current value before compensation as in Equation 2 below, and may be acquired from the storage 130 as described above.

$$\begin{bmatrix} X \\ Y \\ Z \end{bmatrix} = \begin{bmatrix} X_r & X_g & X_b \\ Y_r & Y_g & Y_b \\ Z_r & Z_g & Z_b \end{bmatrix} \begin{bmatrix} R \\ G \\ B \end{bmatrix} \quad \text{[Mathematical formula 2]}$$

Thereafter, when a current before compensation is applied as in Equation 3 below, the processor 140 may calculate the compensation gray level so that the color coordinate (X, Y, Z) corresponding to the gray level value of the input image is the same as the color coordinate (X', Y', Z') corresponding to the compensated gray level value when reduced current is applied.

$$\begin{bmatrix} X' \\ Y' \\ Z' \end{bmatrix} = \begin{bmatrix} X \\ Y \\ Z \end{bmatrix} \quad \text{[Mathematical formula 3]}$$

Equation 4 is derived from Equation 3.

$$\begin{bmatrix} X_{mr} & X_{mg} & X_{mb} \\ Y_{mr} & Y_{mg} & Y_{mb} \\ Z_{mr} & Z_{mg} & Z_{mb} \end{bmatrix} \begin{bmatrix} R' \\ G' \\ B' \end{bmatrix} = \begin{bmatrix} X_r & X_g & X_b \\ Y_r & Y_g & Y_b \\ Z_r & Z_g & Z_b \end{bmatrix} \begin{bmatrix} R \\ G \\ B \end{bmatrix} \quad \text{[Mathematical formula 4]}$$

Here, the 3×3 matrix on the left side may be a current value after compensation, that is, a conversion coefficient corresponding to the reduced current value, and may be obtained from the storage 130 as described above.

Accordingly, the compensated gray level values R', G' and B' of the input image may be calculated by Equation 5 as shown below.

$$\begin{bmatrix} R' \\ G' \\ B' \end{bmatrix} = \begin{bmatrix} X_{mr} & X_{mg} & X_{mb} \\ Y_{mr} & Y_{mg} & Y_{mb} \\ Z_{mr} & Z_{mg} & Z_{mb} \end{bmatrix}^{-1} \begin{bmatrix} X_r & X_g & X_b \\ Y_r & Y_g & Y_b \\ Z_r & Z_g & Z_b \end{bmatrix} \begin{bmatrix} R \\ G \\ B \end{bmatrix} \quad \text{[Mathematical formula 5]}$$

When the luminance value is changed according to the JND, a method of changing or decreasing the luminance value Y in the xyY color space can be used.

The processor 140 may convert the R, G and B gray level values of the input image into X, Y and Z color coordinates. Here, the R, G and B gray level values may substantially be a luminance value generated by converting the gray level values by a gamma curve as described above.

Figure 10:
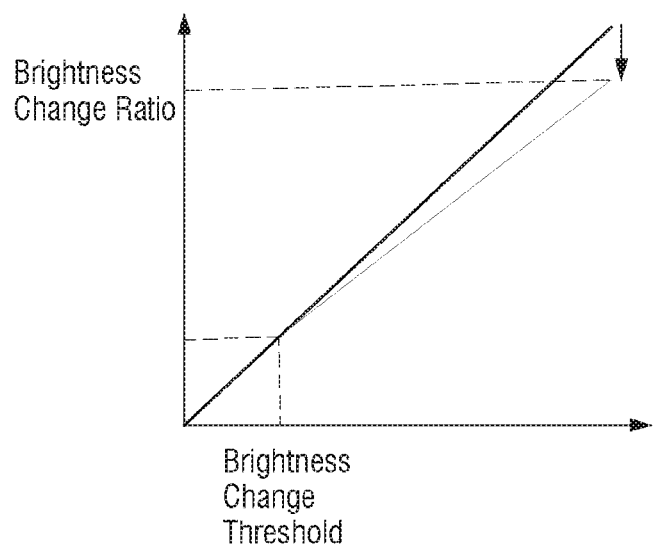
FIG. 10 is a diagram illustrating a method of determining a target luminance according to another example embodiment.

Thereafter, the processor 140 may convert the X, Y and Z color coordinates back to x, y, Y color coordinates. Thereafter, the processor 140 may change the luminance value Y" (where Y"<Y) which is recognizable by the user to be the same luminance according to the JND principle, and may convert the changed x, y, Y" color coordinates back to X", Y" and Z" color coordinates. For example, a luminance adjustment from the luminance value Y to the luminance value Y" may be performed in the method illustrated in FIG. 10.

Thereafter, the processor 140 may acquire the converted gray level values R", G" and B" values which satisfy the JND from the X", Y" and Z" color coordinates. Here, the R", G" and B" values may substantially be luminance values generated by converting the gray level values by a gamma curve as described above.

This can be sequentially expressed as Equation 6.

$$XYZ \rightarrow xyY \rightarrow xyY'' \rightarrow X''Y''Z'' \quad \text{[Mathematical formula 6]}$$

Figure 11:
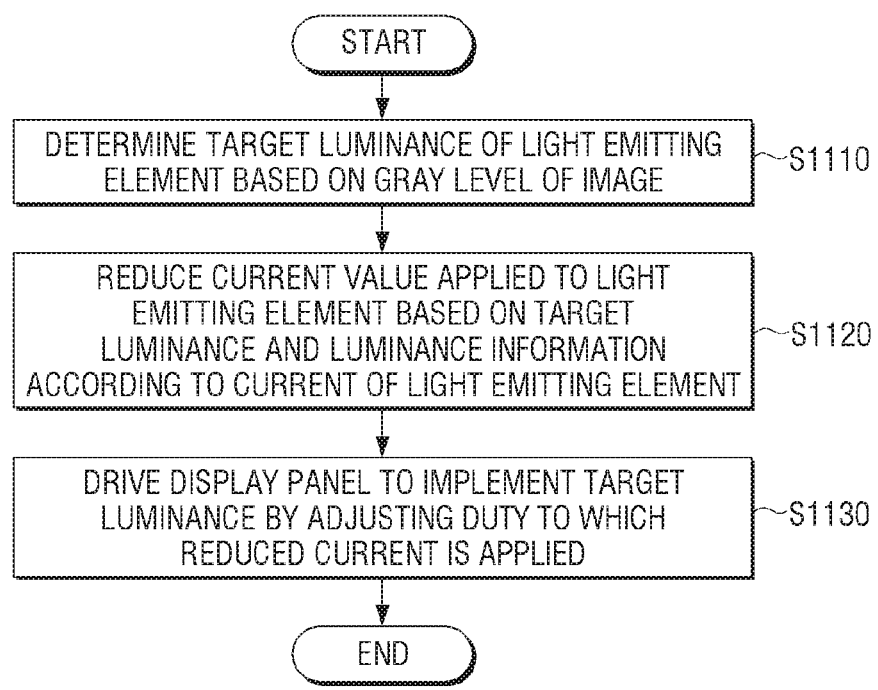
FIG. 11 is a flowchart illustrating a driving method of the display apparatus according to an example embodiment.

FIG. 11 is a diagram to illustrate a driving method of a display apparatus according to an example embodiment.

According to the driving method of a display panel according to an example embodiment illustrated in FIG. 11, the target luminance of a light emitting element is determined based on a gray level of an image, at step S1110. Here, the light emitting element may be realized as red (R) LED, green (G) LED, and blue (B) LED.

Thereafter, a current value applied to a plurality of light emitting element is adjusted based on target luminance and luminance information according to current of the plurality of light emitting elements, at step S1120.

Thereafter, the display panel is driven by adjusting duty to which the current adjusted to implement the target luminance is applied, at step S1130.

At the step S1120, to adjust the current value, the current applied to the light emitting element may be decreased. In this case, at the step S1130, the gray level of the image may be elevated to compensate for the luminance value lowered according to the reduced current, and duty to which the current adjusted to correspond to the elevated gray level is applied may be increased.

In addition, the driving method may determine the target luminance of the light emitting element in the same recognition luminance range recognized as the same luminance as the luminance of the light emitting element corresponding to the gray level of the image.

Here, the light emitting element may include a plurality of sub pixels and the luminance information may include luminance information according to current for each of the sub pixels.

At step S1120, to adjust the current value, a current value applied to at least one sub pixel of which the luminance increase rate is greater than the current increase rate based on luminance information according to the current for each sub pixel may be reduced.

At step S1120, to adjust the current value, based on the luminance information according to the current for each sub pixel, when the target luminance belongs to a luminance interval in which the current increase rate is greater than the luminance increase rate, the current value applied to at least one sub pixel may be reduced.

The lighting emitting element may include a plurality of sub pixels and the luminance information may include current control information according to luminance for each sub pixel calibrated based on luminance information according to the current for each of the sub pixels.

At step S1110, to determine the target luminance of the light emitting element, the display panel may be divided into a plurality of local areas and the target luminance value may be determined for each of the local areas based on the maximum gray level value of the image displayed in each local area. In this case, at the step S1120, a current value applied to each local area may be determined based on the target luminance value of each local area.

The driving method described above may, when a current value to be applied to each local area is determined, further include the step of re-adjusting a current value applied to each local area by applying a low pass filtering.

The methods according to various example embodiments described above may be implemented by only software/hardware upgrade for existing unit display module and/or a display apparatus including unit display module.

Further, a non-transitory computer readable medium recording therein program to sequentially perform a driving method according to example embodiments may be provided.

The aforementioned driving methods according to the various example embodiments may be implemented as a program code executable by a computer, and the code may be stored in a non-transitory computer-readable medium to be executed by the processor.

The non-transitory computer readable medium refers to a medium that stores data semi-permanently rather than storing data for a very short time, such as a register, a cache, a memory or etc., and is readable by an apparatus. In detail, the above-described various applications or programs may be stored in the non-transitory computer readable medium, for example, a compact disc (CD), a digital versatile disc (DVD), a hard disc, a Blu-ray disc, a universal serial bus (USB), a memory card, a read only memory (ROM), and the like, and may be provided.

For example, at least one of these components, elements, modules or units may use a direct circuit structure, such as a memory, a processor, a logic circuit, a look-up table, etc., that may execute the respective functions through controls of one or more microprocessors or other control apparatuses.

What is claimed is:

1. A display apparatus, comprising:
a display panel comprising a plurality of light emitting elements;
a panel driver configured to drive the display panel by applying a current to the plurality of light emitting elements;
a memory configured to store luminance information according to a current of the light emitting elements; and
a processor configured to:
identify a lowest luminance of luminance range recognized by a user to be a same luminance as a target luminance of the light emitting elements according to a gray level of an image,
reduce a current applied to the light emitting elements based on the target luminance, the current corresponding to a luminance according to the gray level of the image,
elevate the gray level of the image to compensate a luminance value lowered according to the reduced current, and
control the panel driver to drive the display panel by increasing a duty to which the reduced current is applied to correspond to the elevated gray level based on the stored luminance information.

2. The apparatus as claimed in claim 1, wherein the light emitting elements include a plurality of sub pixels, and
wherein the luminance information comprises luminance information according to a current for each of the sub pixels.

3. The apparatus as claimed in claim 2, wherein the processor is further configured to reduce a current value applied to at least one sub pixel in which a luminance increase rate is greater than a current increase rate based on the luminance information according to the current for each of the sub pixels.

4. The apparatus as claimed in claim 3, wherein the processor is further configured to, in response to the target luminance belonging to a luminance interval in which the luminance increase rate is greater than the current increase rate, reduce a current value applied to the at least one sub pixel and increase a duty to which the current is applied.

5. The apparatus as claimed in claim 1, wherein the light emitting elements include a plurality of sub pixels, and
wherein the luminance information comprises current control information according to a luminance for each sub pixel calibrated based on luminance information according to a current for each of the sub pixels.

6. The apparatus as claimed in claim 1, wherein the processor is further configured to divide the display panel into a plurality of local areas and determine a target luminance value for each of the local areas based on a maximum gray level value of an image displayed in each local area, and determine a current value applied to each local area based on a target luminance value of each local area.

7. The apparatus as claimed in claim 6, wherein the processor is further configured to, in response to a current value applied to each of the local areas being determined, readjust a current value applied to each of the local areas by applying a low pass filtering.

8. The apparatus as claimed in claim 1, wherein the light emitting elements are implemented as a red LED (light-emitting diode), a green LED, and a blue LED.

9. A driving method of a display panel comprising a plurality of light emitting elements, the method comprising:
identifying a lowest luminance of luminance range recognized by a user to be a same luminance as a target luminance of the light emitting elements according to a gray level of an image;
reducing a current applied to the light emitting elements based on the target luminance, the current corresponding to a luminance according to the gray level of the image;
elevating the gray level of the image to compensate a luminance value lowered according to the reduced current; and
increasing a duty to which the reduced current is applied to correspond to the elevated gray level based on luminance information stored in a memory.

10. The method as claimed in claim 9, wherein the light emitting elements include a plurality of sub pixels, and wherein the luminance information comprises luminance information according to a current for each of the sub pixels.

11. The method as claimed in claim 10, wherein the increasing comprises reducing a current value applied to at least one sub pixel in which a luminance increase rate is greater than a current increase rate based on luminance information according to the current for each of the sub pixels.

12. The method as claimed in claim 11, wherein the increasing comprises, in response to the target luminance belonging to a luminance interval in which a luminance increase rate is greater than the current increase rate, reducing a current value applied to the at least one sub pixel based on the luminance information according to the current for each of the sub pixels.

13. The method as claimed in claim 9, wherein the light emitting element comprises a plurality of sub pixels, and
wherein the luminance information comprises current control information according to luminance for each of sub pixels calibrated based on luminance information according to a current for each of the sub pixels.

14. A display apparatus comprising:
a panel driver configured to drive a display panel by applying a current to a plurality of light emitting elements; and
a processor configured to:
identify a lowest luminance of luminance range recognized by a user to be a same luminance as a target luminance of the light emitting elements according to a gray level of an image,
reduce a current applied to the light emitting elements based on the target luminance, the current corresponding to a luminance according to the gray level of the image,
elevate the gray level of the image to compensate a luminance value lowered according to the reduced current, and
control the panel driver to increase a duty to which the reduced current is applied to correspond to the elevated gray level based on luminance information that is stored in a memory and to adjust a time to which the reduced current is applied.

15. The display apparatus of claim 14, wherein the processor is further configured to reduce a current value applied to at least one pixel in which a luminance increase rate is greater than a current increase rate based on the luminance information according to the current for each pixel.

16. The display apparatus of claim 1, wherein the target luminance is determined based on a maximum output luminance of the display panel and the gray level of the image adjusted according to a just noticeable difference theory.

17. The display apparatus of claim 1, wherein the luminance information stored in the memory comprises information about a luminance change according to a current change which varies based on color characteristics of the light emitting elements.

18. The display apparatus of claim 1, wherein the luminance information further comprises a number of pixels for each of the plurality of light emitting elements, size of pixels, and interval between the pixels,
wherein the processor is further configured to, based on the target luminance of a sub pixel belonging to a luminance interval of which luminance increase ratio is larger than a current increase ratio, control the panel driver to implement the target luminance by reducing a current value applied to at least one sub pixel and increasing a time for which the current is applied, and
wherein the current value is reduced differently based on color characteristics of the sub pixel.

* * * * *